(12) United States Patent
Takeuchi (10) Patent No.: US 7,679,424 B2
(45) Date of Patent: Mar. 16, 2010

(54) SEMICONDUCTOR DEVICE WITH PAD SWITCH

(75) Inventor: Atsushi Takeuchi, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 7 days.

(21) Appl. No.: 11/798,329

(22) Filed: May 11, 2007

(65) Prior Publication Data

US 2007/0268061 A1   Nov. 22, 2007

(30) Foreign Application Priority Data

May 18, 2006   (JP) ............... 2006-139056

(51) Int. Cl.
*H03K 17/00* (2006.01)
(52) U.S. Cl. .................. 327/404; 327/534; 327/427
(58) Field of Classification Search .............. 327/404, 327/408

See application file for complete search history.

(56) References Cited

U.S. PATENT DOCUMENTS

| | | | |
|---|---|---|---|
| 6,194,952 B1 * | 2/2001 | Shigehara | 327/534 |
| 6,965,263 B2 * | 11/2005 | Bringivijayaraghavan | 327/537 |
| 7,119,601 B2 * | 10/2006 | Grimone, III | 327/404 |
| 2004/0070441 A1 | 4/2004 | Bringivijayaraghavan | |
| 2006/0028262 A1 * | 2/2006 | Grimone | 327/427 |

FOREIGN PATENT DOCUMENTS

| | | |
|---|---|---|
| JP | 63-257242 | 10/1988 |
| JP | 4-022000 | 1/1992 |
| JP | 8-304515 | 11/1996 |

OTHER PUBLICATIONS

Chinese Patent Application No. 200710103966.8 "Chinese Office Action", Full English Translation, mailed Jan. 23, 2009.

* cited by examiner

*Primary Examiner*—Long Nguyen
(74) *Attorney, Agent, or Firm*—Fujitsu Patent Center (57) ABSTRACT

A semiconductor device includes a pad, an internal power supply line, a pad switch including a MOS transistor to provide an electrically connectable coupling between the internal power supply line and the pad by use of a source-drain channel thereof, and a control circuit configured to control an electrical connection with respect to at least one of a gate node and a back-gate node of the MOS transistor, wherein the control circuit is configured such that at least one of the gate node and the back-gate node is electrically connectable to the pad.

13 Claims, 11 Drawing Sheets

| | SWITCH STATE | | |
|---|---|---|---|
| | ON | OFF | VOLTAGE EXCEEDING POWER SUPPLY |
| tes | H | L | L |
| dpv | L | L | H |

SEMICONDUCTOR DEVICE WITH PAD SWITCH

CROSS-REFERENCE TO RELATED APPLICATIONS

The present application is based upon and claims the benefit of priority from the prior Japanese Patent Application No. 2006-139056 filed on May 18, 2006, with the Japanese Patent Office, the entire contents of which are incorporated herein by reference.

BACKGROUND OF THE INVENTION

1. Field of the Invention

The present invention generally relates to semiconductor devices, and particularly relates to a semiconductor device provided with a pad switch for switching electrical connections with respect to a pad.

2. Description of the Related Art

LSIs manufactured at factory are subjected to operation tests at the time of shipment. In the operation tests, a plurality of probe needles of a tester are simultaneously brought in connection with a plurality of pads so as to input required test signals and to detect output signals. Based on the observation of the output signals, a check is made as to whether the operation of the LSI is erroneous.

In order to reduce the costs of the test, it is desirable to shorten the test time by increasing the number of chips that are concurrently tested. In such a case, the number of pads per chip that are connected to the tester is reduced. There is a need to measure an internal power supply voltage by use of a tester in order to check whether the internal power supply voltage generated inside the chip is set to a correct voltage level, or a need to supply an internal power supply voltage directly from an external source for the purpose of setting the internal power supply voltage to a proper voltage level at the time of the test. In such a case, it is desirable to selectively couple a single pad to one of a plurality of internal power supply voltages.

Figure 1:
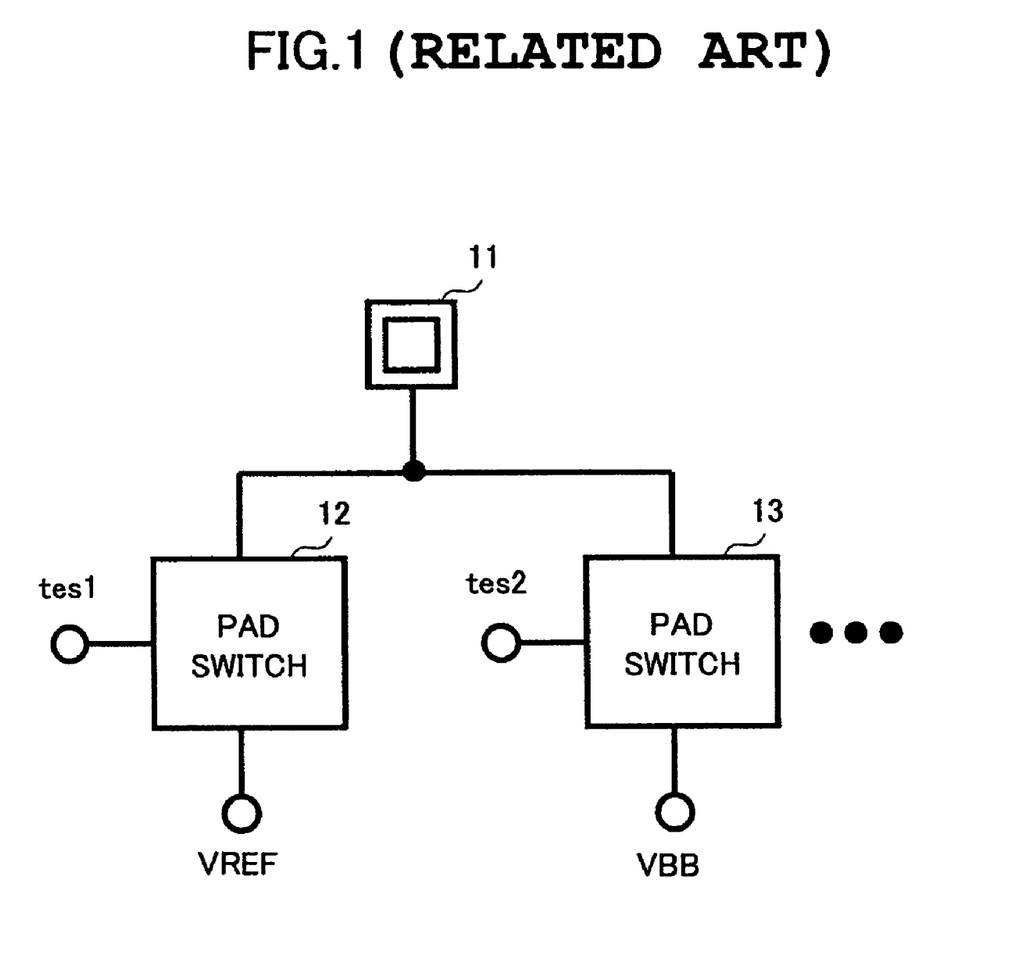
FIG. 1 is a drawing showing an example of a configuration in which pad switches are provided between a pad and a plurality of power supplies.

FIG. 1 is a drawing showing an example of a configuration in which pad switches are provided between a pad and a plurality of power supplies (see Patent Document 1 and Patent Document 2, for example).

As shown in FIG. 1, a pad 11 of a semiconductor chip is connected to an internal voltage VREF via a pad switch 12, and is connected to an internal voltage VBB via a pad switch 13. The pad 11 of the semiconductor chip may further be connected to another internal voltage (not shown) via another pad switch (not shown) The internal voltage VREF is a reference potential generated by a reference voltage generator provided inside a semiconductor chip, for example, and the internal voltage VBB is a negative potential generated by a negative potential power supply unit provided inside the semiconductor chip, for example.

The pad switch 12 becomes conductive (i.e., establishes an electrical path) in response to the asserted state (e.g., HIGH) of a test signal tes1 so as to electrically connect the pad 11 to the internal voltage VREF. By the same token, the pad switch 13 becomes conductive (i.e., establishes an electrical path) in response to the asserted state (e.g., HIGH) of a test signal tes2 so as to electrically connect the pad 11 to the internal voltage VBB.

Figure 2:
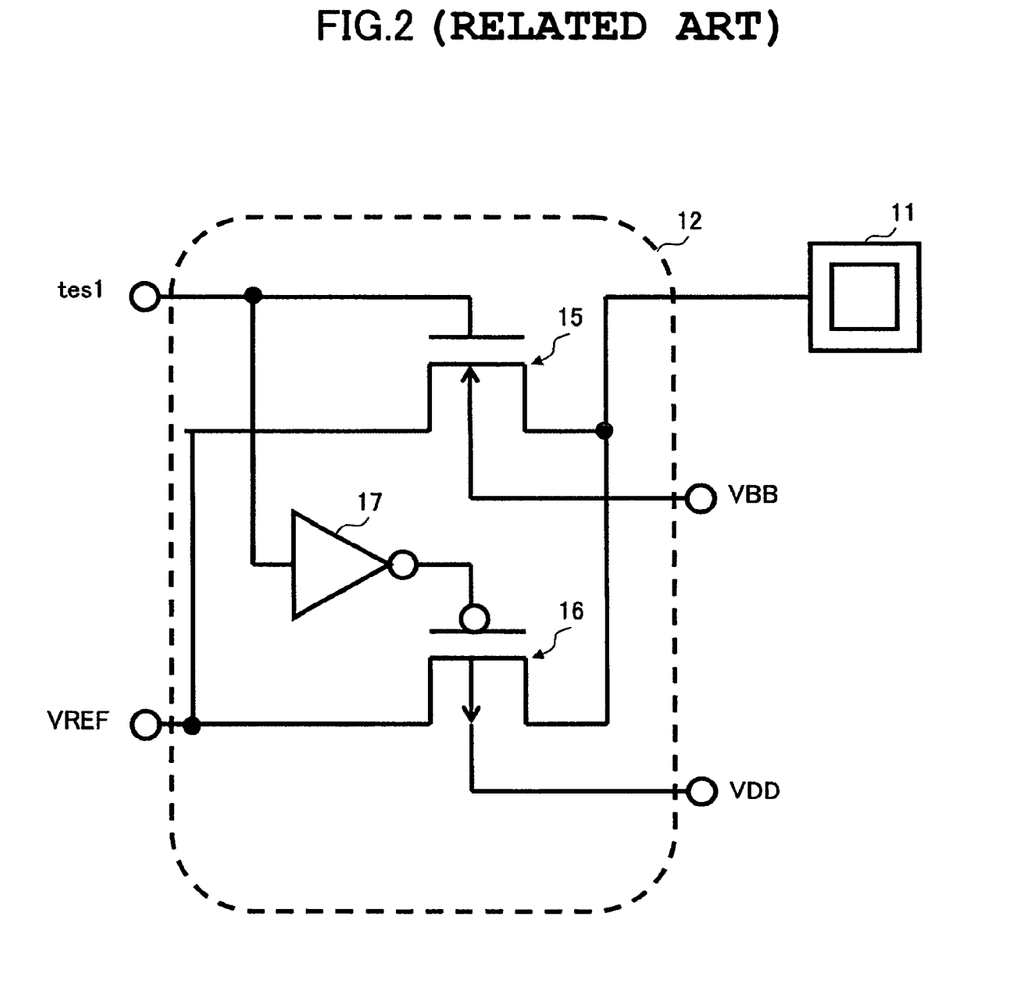
FIG. 2 is a drawing showing an example of the circuit configuration of the pad switch.

FIG. 2 is a drawing showing an example of the circuit configuration of the pad switch. The pad switch 12 shown in FIG. 2 includes an NMOS transistor 15, a PMOS transistor 16, and an inverter 17. The test signal tes1 is applied to the gate of the NMOS transistor 15, and an inversion of the test signal tes1 is applied to the gate of the PMOS transistor 16 via the inverter 17.

The substrate potential (back-gate potential) of the NMOS transistor 15 is set to the lowest potential among the power supply voltages that are output to the pad 11. In this example, the internal voltage VBB is output to the pad 11 as shown in FIG. 1, so that the substrate potential of the NMOS transistor 15 is set to VBB. This arrangement prevents the diffusion layer junction to be placed in the forward-direction biased state when the pad 11 is set to VBB.

The substrate potential (back-gate potential) of the PMOS transistor 16 is set to the highest potential among the power supply voltages that are output to the pad 11. In this example, taking into account a situation in which the power supply voltage VDD is output to the pad 11, the substrate potential of the PMOS transistor 16 is set to VDD. This arrangement prevents the diffusion layer junction to be placed in the forward-direction biased state when the pad 11 is set to VDD.

Figure 3:
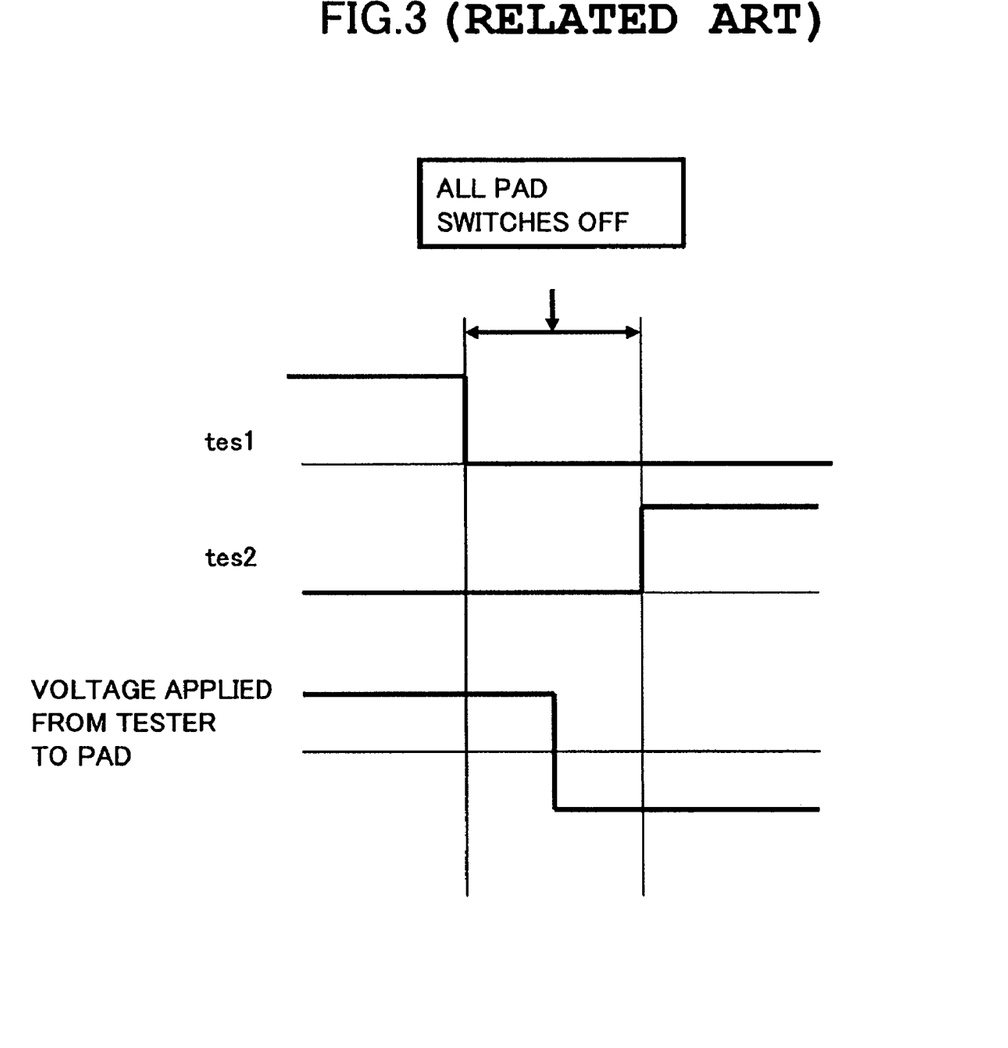
FIG. 3 is a drawing for explaining operations performed when electrical connections between the pad and the internal power supply voltages are switched in response to test signals.

FIG. 3 is a drawing for explaining operations performed when electrical connections between the pad 11 and the internal power supply voltages are switched in response to the test signals. When a voltage is applied to the interior of the semiconductor chip via the pad 11, there is a need to prevent short-circuiting between power supply units and the application of an unintended voltage. To this end, the test signals are switched so as to provide a period during which all the pad switches are OFF as shown in FIG. 3, and the voltage applied from the external source is changed during this period.

Even if the configuration of FIG. 2 and the operations of FIG. 3 are used, however, there is still a problem in that the pad switches cannot be placed in the OFF state when a voltage exceeding the internal power supply voltage (i.e., the power supply voltage used inside the chip) is applied. In the following, a description will be given of an example in which a voltage (e.g., −2.0 V) lower than the internal negative-potential power supply voltage VBB (e.g., −0.5 V) is applied to the pad 11 from an external source. In the configuration shown in FIG. 1, a voltage of −2.0 V may be applied to the pad 11 from an external source, so that the voltage equal to −2.0 V is supplied from the pad 11 to the interior of the chip via another pad switch (not shown). In such a case, the NMOS transistor 15 and the PMOS transistor 16 (see FIG. 2) of the pad switch 12, for example,. need to be placed in the nonconductive state (OFF state).

Figure 4:
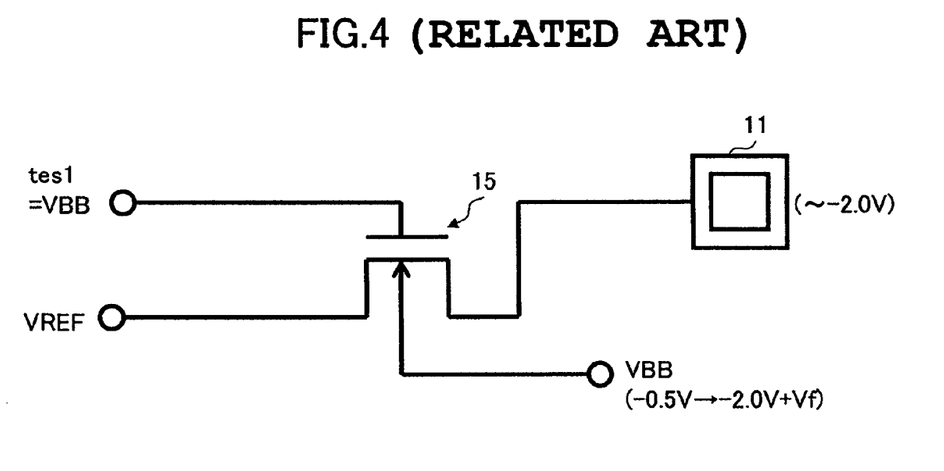
FIG. 4 is a drawing for explaining the operation of the NMOS transistor shown in FIG. 2 when a voltage lower than the internal voltage VBB is applied from an external source to the pad.

FIG. 4 is a drawing for explaining the operation of the NMOS transistor 15 shown in FIG. 2 when a voltage lower than the internal voltage VBB is applied from an external source to the pad 11.

When the NMOS transistor 15 is to be set to the OFF state, the test signal applied to the gate node of the NMOS transistor 15 is VBB. The voltage applied to the back gate node is also VBB, as previously described. The pad 11 and the internal power supply VREF are connected to the source node and the drain node, respectively.

When the voltage of the pad 11 is lower than the internal negative-potential power supply voltage VBB, the N-type diffusion layer junction of the NMOS transistor 15 is placed in the forward-bias state, so that the voltage VBB of the back gate node is set to the voltage that is the pad voltage (i.e., the voltage of the source node) plus the forward voltage (Vf) that is approximately 0.6 V. As a consequence, the voltage VBB applied to the gate node is changed to the voltage that is higher than the source voltage only by Vf, resulting in the NMOS transistor 15 being not in the OFF state. Namely, the NMOS transistor 15 becomes conductive, and, thus, the internal voltage VREF is coupled to the pad 11.

What is described above is directed to the state of the NMOS transistor when a voltage lower than the internal negative-potential power supply voltage is applied to the pad 11. In the same manner, the state of the PMOS transistor 16 undergoes a similar process, and the OFF state is lost, when a voltage higher than an internal stepped-up power supply voltage is applied to the pad 11.

Figure 5:
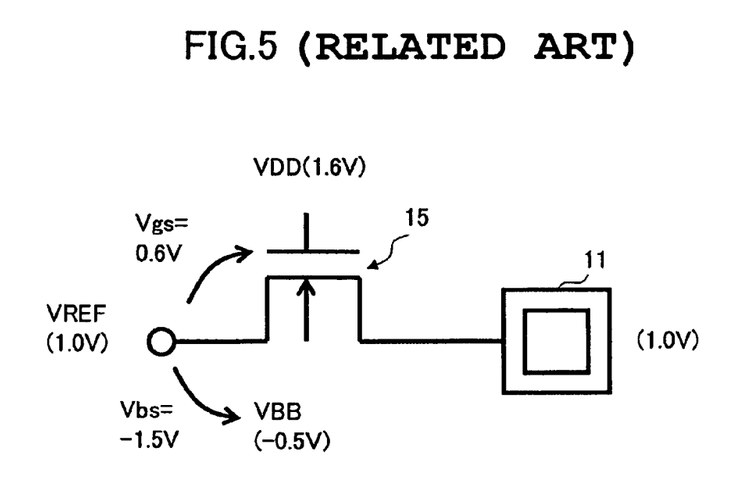
FIG. 5 is a drawing for explaining the operation of the NMOS transistor shown in FIG. 2 when the pad is set to the voltage VREF.

Further, there is a problem in that the conductance of the NMOS transistor 15 becomes small when the potential VREF (e.g, 1.0 V) situated approximately in the middle between VDD (1.6 V) and VBB (−0.5 V) is coupled to the pad 11. FIG. 5 is a drawing for explaining the operation of the NMOS transistor 15 shown in FIG. 2 when the pad 11 is set to the voltage VREF.

When the NMOS transistor 15 is to be set to the ON state, the test signal applied to the gate node of the NMOS transistor 15 is VDD (1.6 V). The voltage applied to the back gate node is VBB (−0.5 V), as previously described. The source node and drain node are set to the internal power supply voltage VREF (1.0 V).

In this case, a voltage Vbs between the back gate and the source becomes as large as −1.5 V due to the setting of the source node to the middle potential, resulting in the threshold voltage (Vth) rising due to the back-bias effect. Also, a gate-source voltage Vgs becomes as small as 0.6 V. As a result, the conductance of the NMOS transistor 15 is lowered, giving rise to the problem that electrical conductance is not sufficient.

[Patent Document 1] Japanese Patent Application Publication No. 63-257242

[Patent Document 2] Japanese Patent Application Publication No. 8-304515

[Patent Document 3] Japanese Patent Application, Publication No. 4-22000

Accordingly, there is a need for a pad switch that can maintain its OFF state even when a voltage higher than the internally used power supply voltage is applied to the pad, and that can assume a sufficient ON state even when a middle potential couples between an internal power supply and the pad.

SUMMARY OF THE INVENTION

It is a general object of the present invention to provide a pad switch that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a pad switch particularly pointed out in the specification in such full, clear, concise, and exact terms as to enable a person having ordinary skill in the art to practice the invention.

To achieve these and other advantages in accordance with the purpose of the invention, the invention provides a semiconductor device which includes a pad, an internal power supply line, a pad switch including a MOS transistor to provide an electrically connectable coupling between the internal power supply line and the pad by use of a source-drain channel thereof, and a control circuit configured to control an electrical connection with respect to at least one of a gate node and a back-gate node of the MOS transistor, wherein the control circuit is configured such that at least one of the gate node and the back-gate node is electrically connectable to the pad.

According to at least one embodiment of the present invention, the gate node of the MOS transistor can be electrically connected to the pad. Even when a voltage exceeding the power supply voltage is applied to the pad, thus, the OFF state (i.e., nonconductive state) of the MOS transistor can be maintained. Further, when the MOS transistor is to be placed in the ON state (i.e., conductive state), the back-gate node is electrically connected to the pad so as to set the substrate-source voltage to 0 V. There is thus no rise in the threshold voltage of the MOS transistor caused by the back-bias effect, thereby preventing a drop of the ON-state conductance.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 6:
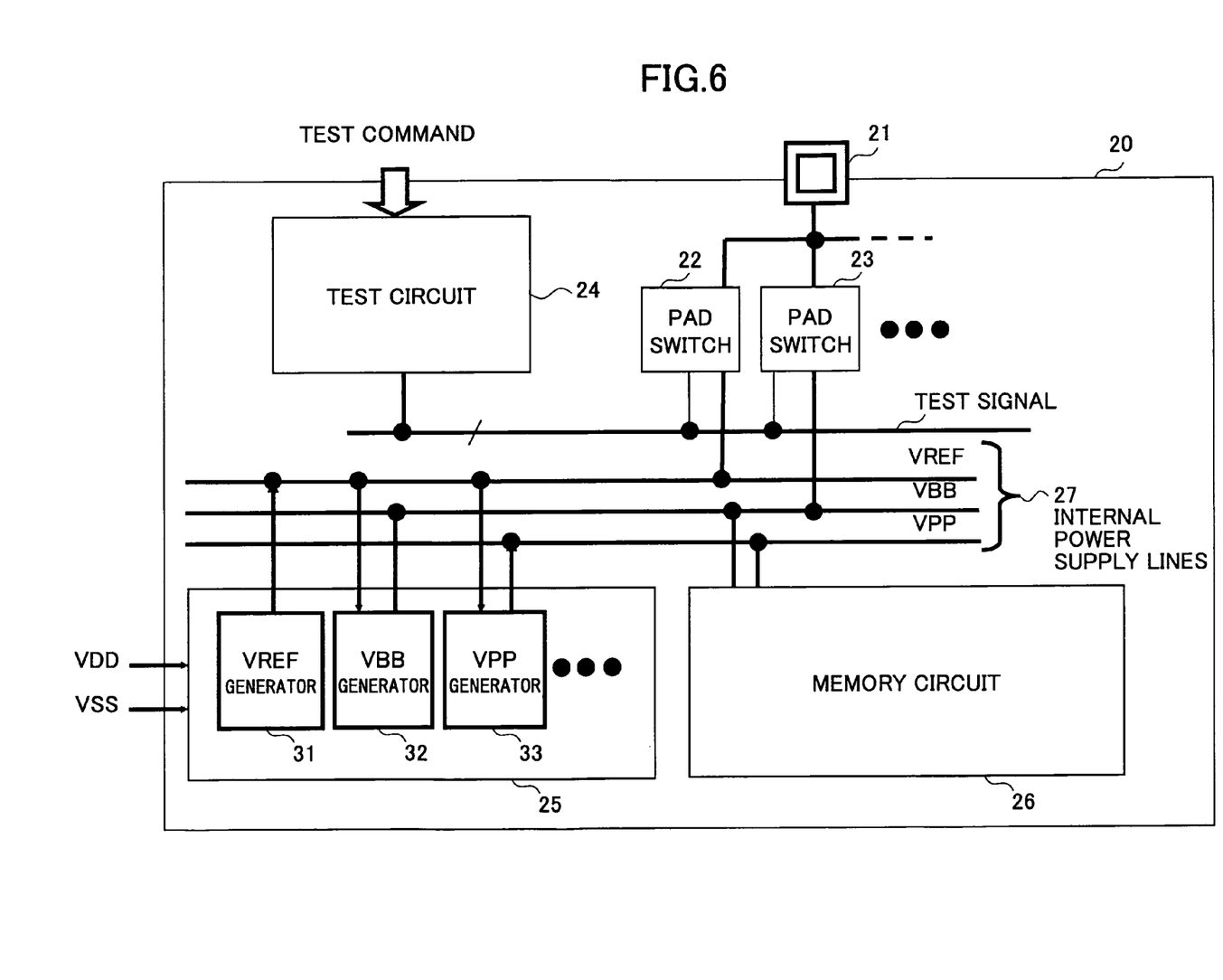
FIG. 6 is a drawing showing an example of the configuration of a semiconductor memory device serving as an example of a semiconductor device to which a pad switch of the present invention is applied.

FIG. 6 is a drawing showing an example of the configuration of a semiconductor memory device serving as an example of a semiconductor device to which a pad switch of the present invention is applied. The pad switch of the present invention is not only applicable to a semiconductor memory device, but also applicable to various types of semiconductor devices for which a test needs to be conducted from the exterior of the device via a pad A semiconductor memory device 20 of FIG. 6 includes a pad 21, a pad switch 22, a pad switch 23, a test circuit 24, an internal power supply circuit 25, a memory circuit 26, and internal power supply lines 27. The internal power supply circuit 25 includes a VREF generator 31, a VBB generator 32, and a VPP generator 33.

The semiconductor memory device 20 is connected to an external tester (not shown), and receives test commands from the external tester. The test circuit 24 decodes the received test commands, and transmits test signals in response to the decoded results. In response to the test signals, the parts of the semiconductor memory device 20 such as the pad switch 22 and the pad switch 23 perform a desired test operation.

The semiconductor memory device 20 supplies an internal power supply voltage to the external tester via the pad 21 in order to allow the external tester to check whether the internal power supply voltage is set to a desired voltage level, and receives an appropriate voltage from the external tester via the pad 21 in order to set the internal power supply voltage to a predetermined voltage that is externally defined. In so doing, the test circuit 24 controls the test signals to make either the pad switch 22 or the pad switch 23 conductive, thereby electrically connecting the pad 21 to the internal power supply lines 27 via either the pad switch 22 or the pad switch 23. The pad 21 of the semiconductor memory device 20 may further be connected to another internal voltage (not shown) via another pad switch (not shown)

The VPP generator 33 generates a stepped-up voltage VPP based on the power supply voltage VDD that is externally provided. Specifically, a pump circuit is used, in which a potential at one end of a capacitor device is moved up and down by an oscillating signal of an oscillator so as to accumulate electric charge in the capacitor at every turn of the up and down movements. The VBB generator 32 generates a negative voltage VBB based on the power supply voltage VSS that is externally provided. The VBB generator 32 may be implemented by use of a capacitor-coupling-based pump circuit in the same manner as the VPP generator 33. The VREF generator 31 serves to generate a reference voltage VREF that is to be used as a reference level in voltage comparisons, which are performed in many parts of the semiconductor memory device 20. The VREF generator 31 may be implemented by use of a resistor-based potential divider, for example. The reference voltage VREF may be used as a reference level in the VPP generator 33 and the VBB generator 32.

The memory circuit 26 includes a core circuit comprised of a memory cell array, bit lines, word lines, sense amplifiers, and so on, an address decoder for decoding an address signal supplied from an exterior, a command decoder for decoding a command signal supplied from an exterior, and a peripheral circuit such as input/output circuits. The memory circuit 26 decodes a command such as a read command or a write command that is supplied from an external source, and performs a data read/write access operation in response to the decoded result with respect to the address indicated by an address signal. The stepped-up voltage VPP is used as a voltage for activating a word line, for example. The negative voltage VBB is used in the memory array, for example.

Figure 7:
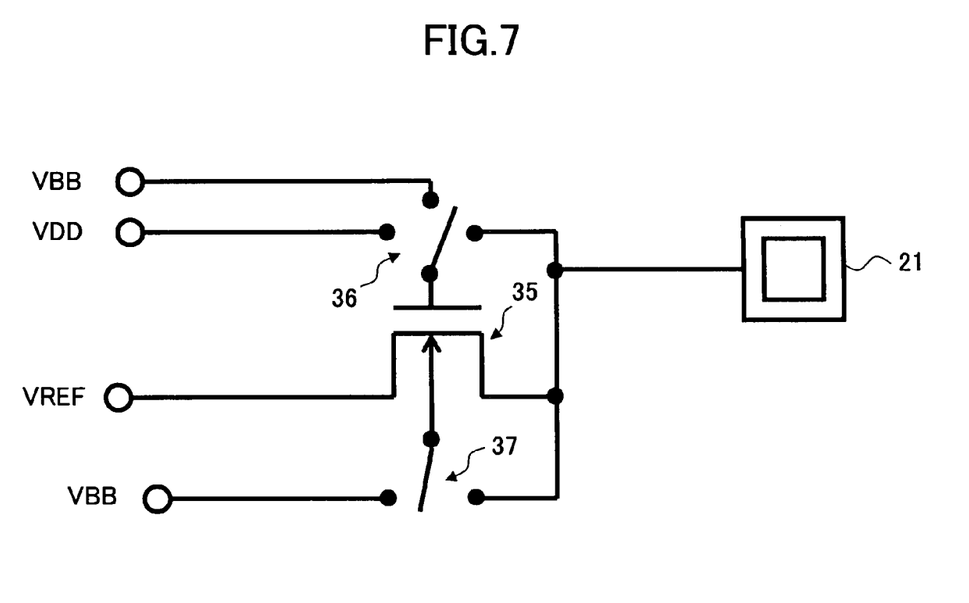
FIG. 7 is a circuit diagram showing the connections of the terminals of an NMOS transistor provided in the pad switch of the present invention.

FIG. 7 is a circuit diagram showing the connections of the terminals of an NMOS transistor provided in the pad switch of the present invention.

An NMOS transistor 35 shown in FIG. 7 serves to electrically connect between the pad 21 and the internal voltage VREF via a source-drain channel thereof, and is used in the pad switch 22. The gate node of the NMOS transistor 35 is configured to be selectively connectable, via a switch circuit 36, to one of the pad 21, the internal power supply voltage VBB, and the power supply voltage VDD supplied from an external source for use in the chip. The back-gate node of the NMOS transistor 35 is configured to be selectively connectable, via a switch circuit 37, to one of the pad 21 and the internal power supply voltage VBB.

The connection states of the switch circuit 36 and the switch circuit 37 are controlled by test signals that are supplied from the test circuit 24 (see FIG. 6).

When a voltage exceeding the internally-used power supply voltage is applied from an external source to the pad 21, i.e., when a voltage lower than the negative voltage VBB generated by the VBB generator 32 is applied from an external source to the pad 21 in the example of the NMOS transistor shown in FIG. 7, the gate node of the NMOS transistor 35 is connected to the pad 21. In cases other than the case in which a voltage exceeding the internally-used power supply voltage is applied to the pad 21, the gate node of the NMOS transistor 35 is connected to one of the internal power supply voltage VBB and the power supply voltage VDD supplied from an external source for use in the device. Specifically, the gate node is connected to the internal power supply voltage VBB when the NMOS transistor 35 needs to be placed in the OFF state (nonconductive state), and is connected to the power supply voltage VDD when the NMOS transistor 35 needs to be placed in the ON state (conductive state).

With the arrangement as described above, the gate node of the NMOS transistor 35 is set to the potential of the pad 21 when a voltage lower than the negative voltage VBB generated by the VBB generator 32 is applied from an external source to the pad 21. The gate potential of the NMOS transistor 35 is thus the same as the source potential, thereby preventing the NMOS transistor 35 from becoming conductive.

Further, the back-gate node is connected to the pad 21 when the NMOS transistor 35 needs to be placed in the conductive state, and is connected to the internal negative voltage VBB when the NMOS transistor 35 needs to be placed in the nonconductive state. With this provision, the back-gate node is set to the same potential as the pad 21, i.e., set to the same potential as the internal power supply voltage VREF when the pad 21 is set to the internal power supply voltage VREF while the NMOS transistor 35 is placed in the conductive state. Accordingly, the back-gate-&-source voltage Vbs is 0 V even when the source and drain nodes of the NMOS transistor 35 are set to the potential VREF (e.g, 1.0 V) situated approximately at the midpoint between VDD (1.6 V) and VBB (−0.5 V), so that there is no rise of the threshold voltage (Vth) due to the back-bias effect. Accordingly, the NMOS transistor 35 is properly set to an ON state (conductive state) even when the gate-source voltage Vgs is about 0.6 V.

Figure 8:
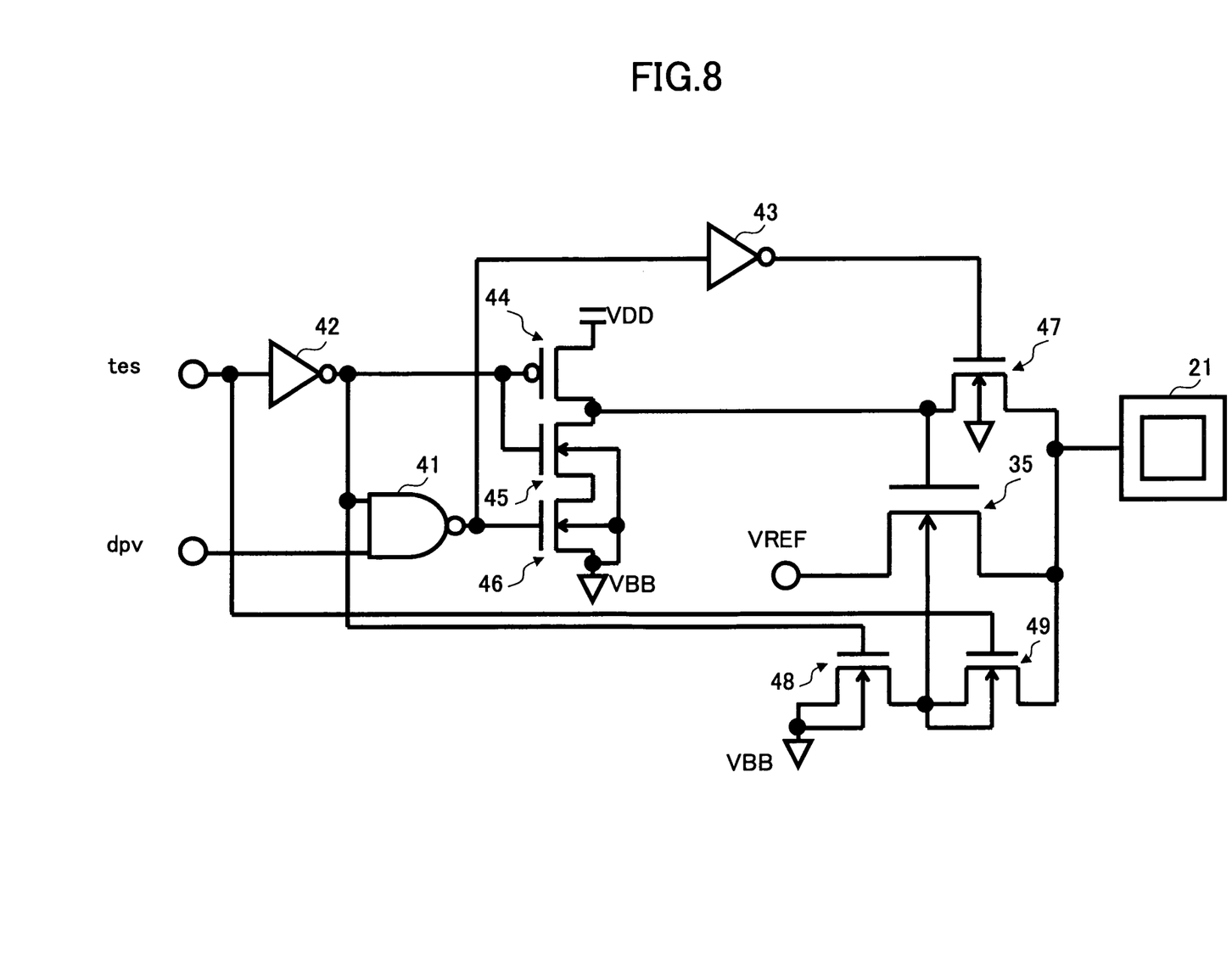
FIG. 8 is a drawing showing an example of the detailed circuit configuration of the pad switch.

FIG. 8 is a drawing showing an example of the detailed circuit configuration of the pad switch 22. The circuit shown in FIG. 8 includes an NMOS transistor 35, an NAND gate 41, an inverter 42, an inverter 43, a PMOS transistor 44, and NMOS transistors 45 through 49.

In the circuit shown in FIG. 8, test signals tes and dpv are supplied from the test circuit 24 shown in FIG. 6. The test circuit 24 sets the test signals tes and dpv in accordance with the decoded result obtained by decoding a test command that is provided from an external source, thereby connecting the gate node and back-gate node of the NMOS transistor 35 to respective, proper potentials.

Figure 9:
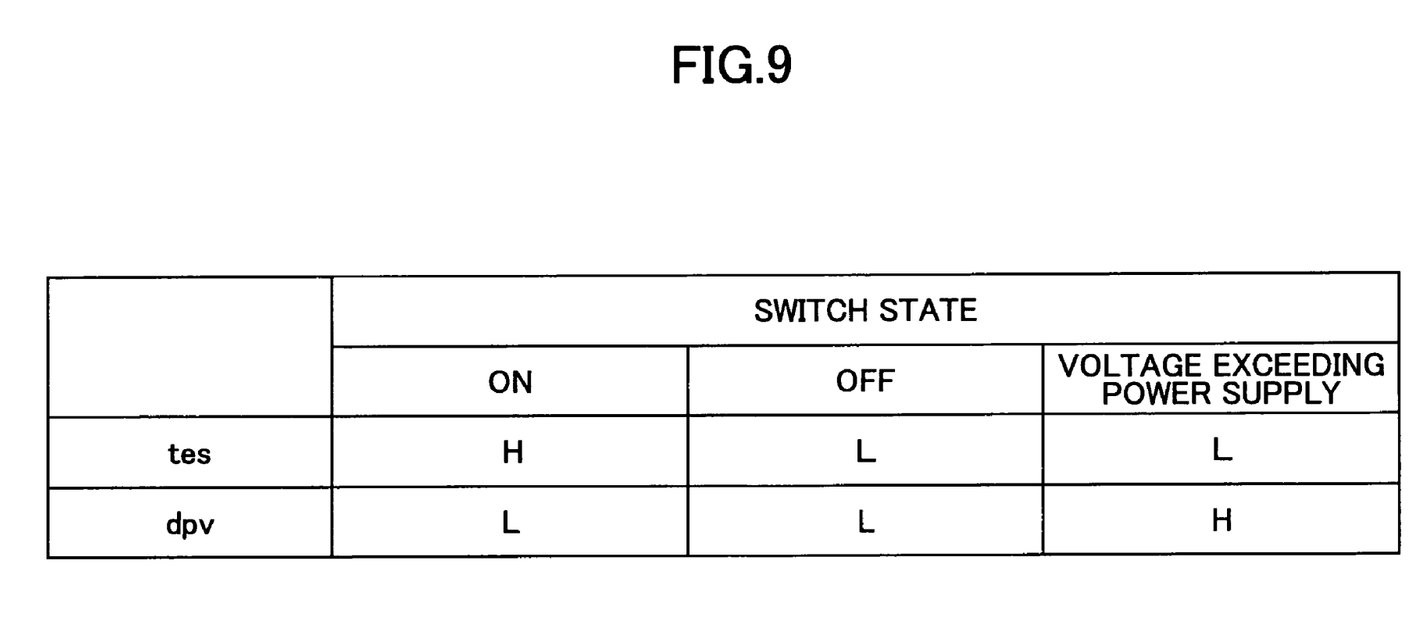
FIG. 9 is a table showing correspondences between the signal values of test signals and the states of switches.

FIG. 9 is a table showing correspondences between the signal values of the test signals tes and dpv and the switch states (i.e., the ON/OFF state of the NMOS transistor 35). As shown in FIG. 9, the conductive/nonconductive state of the NMOS transistor 35 is selected in response to the HIGH/LOW state of the test signal tes, and the-state in which a voltage exceeding the power supply voltage for use inside the chip is applied or the state in which such an exceeding voltage is not applied is selected in response to the HIGH/LOW state of the test signal dpv.

When the NMOS transistor 35 is to be placed in the ON state (i.e., conductive state), the test signals tes and dpv are set to HIGH and LOW, respectively. Since the PMOS transistor 44 is placed in the ON state, the gate node of the NMOS transistor 35 is set to VDD. Further, since the NMOS transistor 49 is placed in the ON state, the back-gate node of the NMOS transistor 35 is coupled to the pad 21.

When the NMOS transistor 35 is to be placed in the OFF state (i.e., nonconductive state), the test signals tes and dpv are both set to LOW. Since the NMOS transistors 45 and 46 are placed in the ON state, the gate node of the NMOS transistor 35 is set to VBB. Further, since the NMOS transistor 48 is placed in the ON state, the back-gate node of the NMOS transistor 35 is coupled to VBB.

When a negative voltage lower than VBB is to be applied to the pad 21, the test signals tes and dpv are set to LOW and HIGH, respectively. Since the NMOS transistor 47 is placed in the ON state, the gate node of the NMOS transistor 35 is coupled to the pad 21. Further, since the NMOS transistor 48 is placed in the ON state, the back-gate node of the NMOS transistor 35 is coupled to VBB.

In the same manner as described in connection with FIG. 7, thus, the gate node of the NMOS transistor 35 is connected to the pad 21 when a voltage exceeding the internally-used power supply voltage is applied from an external source to the pad 21. Further, in cases other than the case in which a voltage exceeding the internally-used power supply voltage is applied to the pad 21, the gate node is connected to the internal power supply voltage VBB when the NMOS transistor 35 is to be placed in the OFF state (nonconductive state), and is connected to the power supply voltage VDD when the NMOS transistor 35 is to be placed in the ON state (conductive state). Further, the back-gate node is connected to the pad 21 when the NMOS transistor 35 needs to be placed in the conductive state, and is connected to the internal negative voltage VBB when the NMOS transistor 35 needs to be placed in the nonconductive state.

Figure 10:
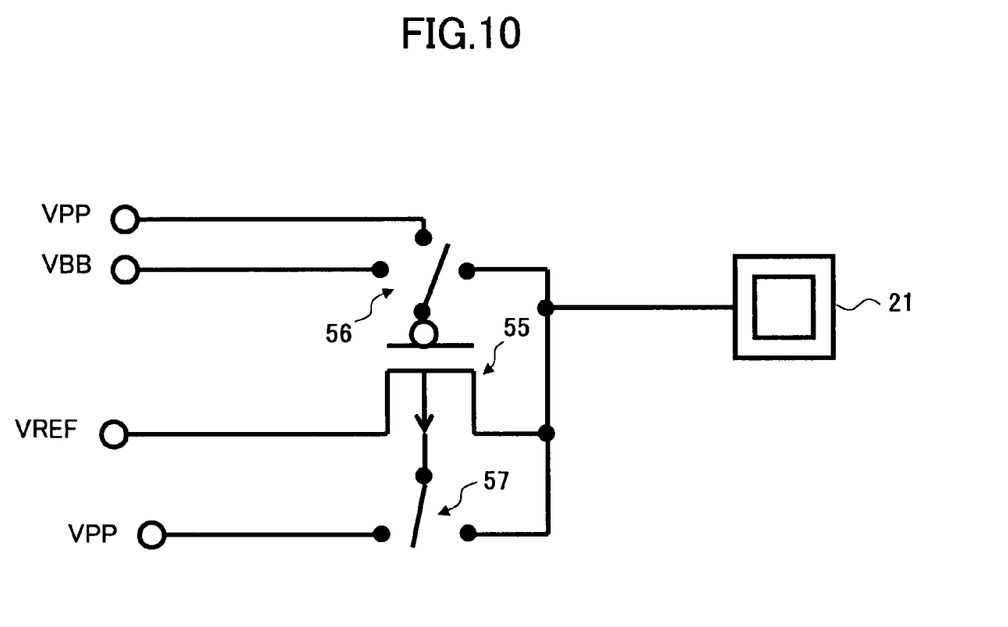
FIG. 10 is a circuit diagram showing the connections of the nodes of a PMOS transistor provided in the pad switch of the present invention.

FIG. 10 is a circuit diagram showing the connections of the nodes of a PMOS transistor provided in the pad switch of the present invention.

A PMOS transistor 55 shown in FIG. 10 serves to electrically connect between the pad 21 and the internal voltage VREF via a source-drain channel thereof, and is used in the pad switch 22. The gate node of the PMOS transistor 55 is configured to be selectively connectable, via a switch circuit 56, to one of the pad 21, the internal power supply voltage VBB, and the internal power supply voltage VPP. The back-gate node of the PMOS transistor 55 is configured to be selectively connectable, via a switch circuit 57, to one of the pad 21 and the internal power supply voltage VPP.

The connection states of the switch circuit 56 and the switch circuit 57 are controlled by test signals that are supplied from the test circuit 24 (see FIG. 6).

When a voltage exceeding the internally-used power supply voltage is applied from an external source to the pad 21, i.e., when a voltage higher than the stepped-up voltage VPP generated by the VPP generator 33 is applied from an external source to the pad 21 in the example of the PMOS transistor shown in FIG. 10, the gate node of the PMOS transistor 55 is connected to the pad 21. In cases other than the case in which a voltage exceeding the internally-used power supply voltage is applied to the pad 21, the gate node of the PMOS transistor 55 is connected to one of the internal power supply voltage VBB and the internal power supply voltage VPP. Specifically, the gate node is connected to the internal power supply voltage VPP when the PMOS transistor 55 needs to be placed in the OFF state (nonconductive state), and is connected to the internal power supply voltage VBB when the PMOS transistor 55 needs to be placed in the ON state (conductive state).

With the arrangement as described above, the gate node of the PMOS transistor 55 is set to the potential of the pad 21 when a voltage higher than the stepped-up voltage VPP generated by the VPP generator 33 is applied from an external source to the pad 21. The gate potential of the PMOS transistor 55 is thus the same as the source potential, thereby preventing the PMOS transistor 55 from becoming conductive.

Further, the back-gate node is connected to the pad 21 when the PMOS transistor 55 needs to be placed in the conductive state, and is connected to the internal stepped-up voltage VPP when the PMOS transistor 55 needs to be placed in the nonconductive state. With this provision, the back-gate node is set to the same potential as the pad 21, i.e., set to the same potential as the internal power supply voltage VREF when the pad 21 is set to the internal power supply voltage VREF while the PMOS transistor 55 is placed in the conductive state. Accordingly, the back-gate-&-source voltage Vbs is 0 V even when the source and drain nodes of the PMOS transistor 55 are set to the midpoint potential VREF, so that there is no rise of the threshold voltage (Vth) due to the back-bias effect. In this case, the gate-source voltage Vgs is about −1.5 V, so that the PMOS transistor 55 is properly set to an ON state (conductive state).

Figure 11:
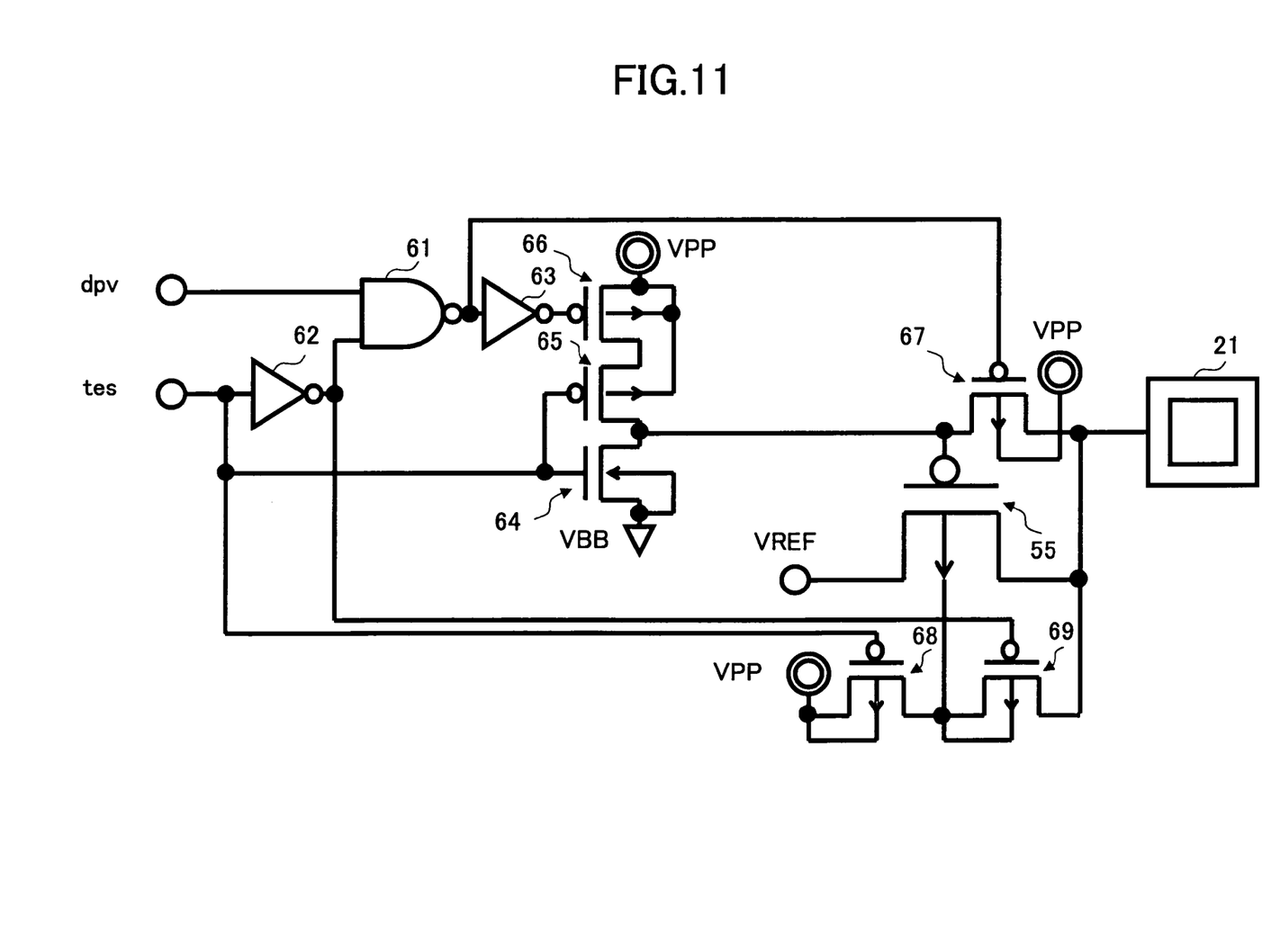
FIG. 11 is a drawing showing an example of the detailed circuit configuration of the pad switch.

FIG. 11 is a drawing showing an example of the detailed circuit configuration of the pad switch 22. The circuit shown in FIG. 11 includes a PMOS transistor 55, an NAND gate 61, an inverter 62, an inverter 63, an NMOS transistor 64, and PMOS transistors 65 through 69.

In the circuit shown in FIG. 11, test signals tes and dpv are supplied from the test circuit 24 shown in FIG. 6. The test circuit 24 sets the test signals tes and dpv in accordance with the decoded result obtained by decoding a test command that is provided from an external source, thereby connecting the gate node and back-gate node of the NMOS transistor 35 to respective, proper potentials. These test signals are set in accordance with the table shown in FIG. 9. Namely, the conductive/nonconductive state of the PMOS transistor 55 is selected in response to the HIGH/LOW state of the test signal tes, and the state in which a voltage exceeding the power supply voltage for use inside the chip is applied or the state in which such an exceeding voltage is not applied is selected in response to the HIGH/LOW state of the test signal dpv.

When the PMOS transistor 55 is to be placed in the ON state (i.e., conductive state), the test signals tes and dpv are set to HIGH and LOW, respectively. Since the NMOS transistor 64 is placed in the ON state, the gate node of the PMOS transistor 55 is set to VBB. Further, since the PMOS transistor 69 is placed in the ON state, the back-gate node of the PMOS transistor 55 is coupled to the pad 21.

When the PMOS transistor 55 is to be placed in the OFF state (i.e., nonconductive state), the test signals tes and dpv are both set to LOW. Since the PMOS transistors 65 and 66 are placed in the ON state, the gate node of the PMOS transistor 55 is set to VPP. Further, since the PMOS transistor 68 is placed in the ON state, the back-gate node of the PMOS transistor 55 is coupled to VPP.

When a positive voltage higher than VPP is to be applied to the pad 21, the test signals tes and dpv are set to LOW and HIGH, respectively. Since the PMOS transistor 67 is placed in the ON state, the gate node of the PMOS transistor 55 is coupled to the pad 21. Further, since the PMOS transistor 68 is placed in the ON state, the back-gate node of the PMOS transistor 55 is coupled to VPP.

In this manner, the gate node of the PMOS transistor 55 is connected to the pad 21 when a voltage exceeding the internally-used power supply voltage is applied from an external source to the pad 21. Further, in cases other than the case in which a voltage exceeding the internally-used power supply voltage is applied to the pad 21, the gate node is connected to the internal power supply voltage VPP when the PMOS transistor 55 is to be placed in the OFF state (nonconductive state), and is connected to the internal power supply voltage VBB when the PMOS transistor 55 is to be placed in the ON state (conductive state). Further, the back-gate node is connected to the pad 21 when the PMOS transistor 55 needs to be placed in the conductive state, and is connected to the internal stepped-up voltage VPP when the PMOS transistor 55 needs to be placed in the nonconductive state.

Figure 12:
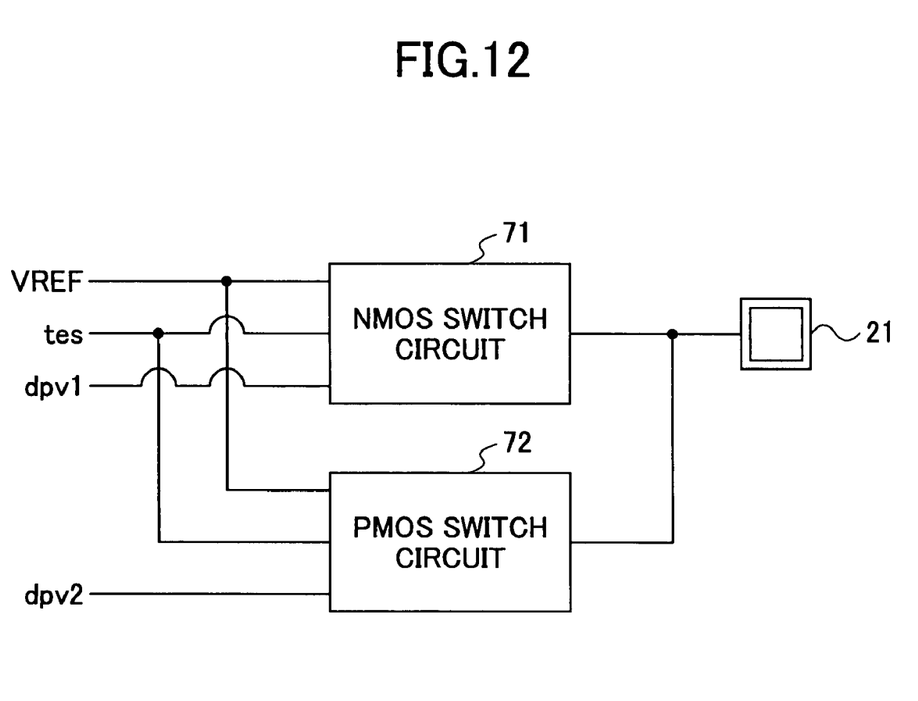
FIG. 12 is a drawing showing yet another example of the configuration of the pad switch.

FIG. 12 is a drawing showing yet another example of the configuration of the pad switch 22. As shown in FIG. 12, the pad switch 12 includes an NMOS switch circuit 71 and a PMOS switch circuit 72.

The NMOS switch circuit 71 is the circuit shown in FIG. 8, and the PMOS switch circuit 72 is the circuit shown in FIG. 11. The pad switch 22 may be constituted only by the NMOS switch circuit 71 shown in FIG. 8, or may be constituted only by the PMOS switch circuit 72 shown in FIG. 11. Alternatively, the pad switch 22 may be constituted by the NMOS switch circuit 71 and the PMOS switch circuit 72 connected in parallel as shown in FIG. 12. With the NMOS switch circuit 71 and the PMOS switch circuit 72 connected in parallel between the pad 21 and internal power supply lines in the manner as illustrated, the NMOS transistor 35 of the NMOS switch circuit 71 and the PMOS transistor 55 of the PMOS switch circuit 72 are. connected in parallel so as to form a CMOS switch.

With the configuration of the pad switch 22 as described here, the gate node of the NMOS transistor 35 of the NMOS switch circuit 71 is set to the potential of the pad 21 in response to the HIGH state of dpv1 even when a voltage lower than (i.e., exceeding) the negative voltage VBB internally used is applied from an external source to the pad 21. Further, the gate node of the PMOS transistor 55 of the PMOS switch circuit 72 is set to the potential of the pad 21 in response to the HIGH state of dpv2 even when a voltage higher than (i.e., exceeding) the power supply voltage VPP internally used is applied from an external source to the pad 21. In any event, thus, the gate potential becomes the same as the source potential, thereby preventing the NMOS transistor 35 or PMOS transistor 55 from becoming conductive.

When test is set to HIGH so that the NMOS transistor 35 of the NMOS switch circuit 71 and the PMOS transistor 55 of the PMOS switch circuit 72 become conductive to set the pad 21 to the internal power supply voltage VREF, the back-gate node is set to the same potential as the pad 21, i.e., to the same potential as the internal power supply voltage VREF. The back-gate-&-source voltage Vbs is thus 0 V in this case, thereby preventing a rise in the threshold voltage (Vth) caused by the back-bias effect. Accordingly, the NMOS transistor 35 and the PMOS transistor 55 are properly set to the ON state (i.e., conductive state).

The description provided above has been given with respect to an example using the pad switch 22. The pad switch 23 that electrically connects between the pad 21 and the internal power supply voltage VBB may be configured in the same manner. It should be noted, however, that if there is no need to conduct a midpoint potential (e.g., VREF), the control of the voltage of the back-gate node according to the present invention may not be necessary. In such a case, provision may be made such that the back-gate node is set to a fixed potential that is either the lowest (in the case of NMOS) or the highest (in the case of PMOS) of the output voltages as in the related-art configuration, and such that the control of voltage according to the present invention is performed only with respect to the gate node. Further, the control of voltage of the gate node according to the present invention may not be necessary if there is no possibility whatsoever that a voltage exceeding the internally used power supply voltage is applied to the pad switch 22 that electrically connects the pad 21 to the internal power supply voltage VREF. In this case, the control of voltage according to the present invention may be performed only with respect to the back-gate node, and the gate node may be configured to be settable to either HIGH or LOW of the internal voltages as in the related-art configuration.

Further, the present invention is not limited to these embodiments, but various variations and modifications may be made without departing from the scope of the present invention.

What is claimed is:

1. A semiconductor device, comprising:
   a pad;
   an internal power supply line;
   a pad switch including a MOS transistor to provide an electrically connectable coupling between the internal power supply line and the pad by use of a source-drain channel thereof; and
   a control circuit configured to control an electrical connection with respect to at least one of a gate node and a back-gate node of the MOS transistor,
   wherein the control circuit is configured such that the gate node and the back-gate node are electrically connectable to the pad,
   wherein the gate couples to a first potential and the back-gate couples to the pad when the MOS transistor becomes conductive, and the gate and the back gate couple to a second potential, which is different from the first potential, when the MOS transistor becomes nonconductive.

2. The semiconductor device as claimed in claim 1, wherein the control circuit is configured to electrically connect the gate node to the pad in a first state, to electrically connect the gate node to the first potential in a second state with no electrical connection between the gate node and the pad, and to electrically connect the gate node to the second potential in a third state with no electrical connection between the gate node and the pad.

3. The semiconductor device as claimed in claim 1, wherein the control circuit is configured to electrically connect the back-gate node to the pad in a first state and to electrically connect the back-gate node to the second potential with no electrical connection between the back-gate node and the pad in a second state.

4. The semiconductor device as claimed in claim 1, wherein the MOS transistor is either an NMOS transistor or a PMOS transistor.

5. The semiconductor device as claimed in claim 1, further comprising
   another MOS transistor connected in parallel to the MOS transistor between the internal power supply line and the pad, wherein one of the MOS transistor and said another MOS transistor is an NMOS transistor, and the other is a PMOS transistor.

6. The semiconductor device as claimed in claim 1, further comprising
a decode circuit configured to decode a command supplied from an external source and to control the control circuit in response to a decoded value of the command.

7. The semiconductor device as claimed in claim 6, wherein the decode circuit includes a test circuit configured to decode the command supplied from said external source and to generate a test signal for controlling a test operation of the semiconductor device in response to the decoded value of the command.

8. The semiconductor device as claimed in claim 1, further comprising:
another internal power supply line; and
another pad switch including a MOS transistor to provide an electrically connectable coupling between said another internal power supply line and the pad by use of a source-drain channel thereof.

9. The semiconductor device as claimed in claim 1, wherein the MOS transistor is an NMOS transistor and the second potential is a negative potential.

10. The semiconductor device as claimed in claim 9, wherein the internal power supply line supplies a third potential that is smaller than the first potential.

11. The semiconductor device as claimed in claim 1, wherein the MOS transistor is a PMOS transistor and the first potential is a negative potential.

12. The semiconductor device as claimed in claim 1, wherein the control circuit is controlled by a test signal.

13. The semiconductor device as claimed in claim 1, wherein the control circuit connects the gate node to the pad when a voltage, which is larger than a positive internal voltage or is smaller than a negative internal voltage, is supplied to the pad.

* * * * *